United States Patent
Shuey

(12) 
(10) Patent No.: US 6,535,000 B2
(45) Date of Patent: Mar. 18, 2003

(54) METHOD AND APPARATUS FOR DETERMINING THE INTERNAL IMPEDANCE OF A DISTRIBUTION TRANSFORMER AND SENSING DC CURRENT THROUGH AN AC POWER METER

(75) Inventor: Kenneth C. Shuey, Zebulon, NC (US)

(73) Assignee: ABB Inc., Norwalk, CT (US)

( * ) Notice: Subject to any disclaimer, the term of this patent is extended or adjusted under 35 U.S.C. 154(b) by 0 days.

(21) Appl. No.: 09/921,173

(22) Filed: Aug. 2, 2001

(65) Prior Publication Data

US 2003/0025509 A1 Feb. 6, 2003

(51) Int. Cl.⁷ .......................... G01R 31/06; G01R 1/00; G01R 11/32; G01R 27/00; H04Q 9/00
(52) U.S. Cl. ................... 324/547; 324/110; 324/103 R; 379/106.03; 702/57; 702/62; 702/65; 700/293; 340/870.07
(58) Field of Search ................... 324/547, 110, 324/103 R, 141, 142, 74, 76.12; 379/106.03; 702/65, 57, 60, 62, 64, 194; 340/870.02, 870.07

(56) References Cited

U.S. PATENT DOCUMENTS

| 4,278,940 | A | * | 7/1981 | Milkovic | 323/357 |
| 5,396,172 | A | * | 3/1995 | Lat et al. | 324/547 |
| 5,461,306 | A | * | 10/1995 | Niven | 324/102 |
| 5,815,558 | A | * | 9/1998 | Bradley et al. | 379/106.04 |

FOREIGN PATENT DOCUMENTS

| GB | 2232493 | * | 12/1990 | 324/547 |

* cited by examiner

Primary Examiner—Christine Oda
Assistant Examiner—Anjan K. Deb
(74) Attorney, Agent, or Firm—Michael M. Rickin, Esq.

(57) ABSTRACT

A method for determining the DC current flowing through an AC power meter. The internal impedance of the distribution transformer is first sensed, then the DC voltage in the AC voltage waveform is measured and finally the measured DC voltage is converted to DC current.

14 Claims, 2 Drawing Sheets

METHOD AND APPARATUS FOR DETERMINING THE INTERNAL IMPEDANCE OF A DISTRIBUTION TRANSFORMER AND SENSING DC CURRENT THROUGH AN AC POWER METER

FIELD OF THE INVENTION

This invention relates to AC power meters and more particularly to the determination of the internal impedance of a distribution transformer and the sensing of DC current flowing in such a meter.

DESCRIPTION OF THE PRIOR ART

Electronic metering of electrical energy is a mature technology and today's meters must minimize hardware cost to be competitive. Typically, one of the major cost elements in a meter is the current transformer that accurately reproduces the waveforms of the current to be measured.

Normally, the current to be measured is the power frequency current, 60 Hz for systems in the United States and 50 Hz for many international systems. In addition to the power frequency currents there are abnormal currents in the form of harmonic and DC currents that can be present in power systems.

Some of the harmonic and DC currents can be created by normal loads found in industry as well as in the home. Others of the abnormal currents are generated by customers that intentionally try to alter the accuracy of their power meter. This is known in the power industry as tampering. The currents resulting from tampering can adversely affect the performance of current transformers at the power frequency where extremely accurate billing information is required. In addition, it is estimated that tampering results in billions of dollars of unpaid for electric power usage in the United States. Thus it is desirable to detect DC current so that customer tampering can be known and reported.

Previous metering technologies have used a variety of current sensing techniques to detect the abnormal currents flowing in an AC power meter. Generally, these sensing techniques compromise the accuracy for the power frequency current. The DC current tends to saturate magnetic materials and consequently it adversely affects accuracy. A typical current sensing material like Supermalloy tends to be expensive and is priced proportional to weight (volume). Because the DC current requires more magnetic material to obtain the same AC accuracy there is a significant cost benefit associated with sizing the current transformer for AC current only and finding a technique for compensating the result when there is DC current present.

Industry has developed other current sensing techniques to solve the problems associated with current transformers and DC current. Devices such as Hall effect sensors have been used to detect AC current in the presence of DC current to prevent tampering. These devices typically do not achieve the accuracy that a high quality current transformer does.

Therefore it is desirable to accurately detect in a cost effective manner the flow of DC current through an AC power meter in order to determine if the customer is tampering with the meter. The present invention meets these requirements. Once the level of DC current flow through the meter has been determined the reporting of tampering can be visually displayed on the meter or brought back through a communications system to a computer for display or warning and the meter billing parameters can be modified.

SUMMARY OF THE INVENTION

A method for determining the DC current flowing through an AC power meter comprising:
(a) measuring the internal impedance of a distribution transformer associated with the meter;
(b) determining the amplitude of the DC voltage component of the AC voltage in the meter; and
(c) calculating the DC current from the measured distribution transformer internal impedance and the determined DC voltage amplitude.

In a power distribution network comprising:
(a) a distribution transformer; and
(b) one or more AC power meters associated with the distribution transformer;
a method for determining the DC current flowing through at least one of the one or more AC power meters comprising:
(i) measuring the internal impedance of the distribution transformer;
(ii) determining the amplitude of the DC voltage component of the AC voltage in the at least one meter; and
(iii) calculating the DC current from the measured distribution transformer internal impedance and the determined DC voltage amplitude.

A method for determining the internal impedance of a distribution transformer comprising:
(a) measuring for a first load condition the current flowing through the distribution transformer internal impedance;
(b) measuring for a second load condition the current flowing through the distribution transformer internal impedance;
(c) matching each of the current measurements for the first and the second load conditions with a corresponding input voltage reading of a power meter connected to the secondary of the distribution transformer;
(d) dividing the difference between the corresponding power meter input voltage readings by the difference between the current measurements for the first and the second load conditions; and
(e) repeating steps (a) to (d) for a predetermined number of iterations performed over a predetermined period of time.

A method comprising:
(a) measuring for a first load condition the current flowing through a distribution transformer internal impedance;
(b) measuring for a second load condition the current flowing through the distribution transformer internal impedance;
(c) matching each of the current measurements for the first and the second load conditions with a corresponding input voltage reading of a power meter connected to the secondary of the distribution transformer;
(d) dividing the difference between. the corresponding power meter input voltage readings by the difference between the current measurements for the first and the second load conditions; and
(e) repeating steps (a) to (d) for a predetermined number of iterations performed over a predetermined period of time to determine the internal impedance of the distribution transformer.

DESCRIPTION OF THE PREFERRED EMBODIMENT(S)

As is described in more detail below, the present invention achieves accurate measurement of the level of DC current flowing through an AC power meter by first sensing the internal impedance of the distribution transformer, then measuring the DC voltage in the AC voltage waveform and finally converting the DC voltage to DC current.

Figure 1:
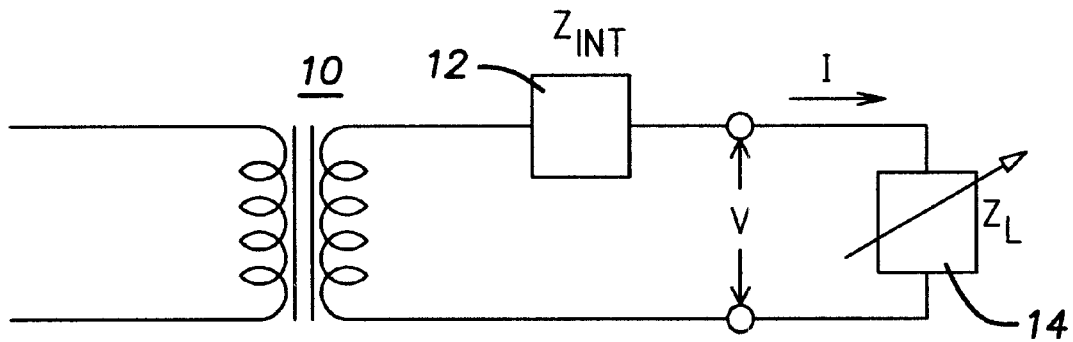
FIG. 1 shows a schematic diagram of the distribution transformer associated with a power meter.

Referring now to FIG. 1, there is shown a schematic diagram of the distribution transformer 10 associated with a power meter. Transformer 10 includes an internal impedance $Z_{INT}$ 12. The secondary of transformer 10 is connected to a variable load represented by impedance $Z_L$ 14. A current I flows through $Z_{INT}$ 12 and $Z_L$ 14.

Measurement of $Z_{INT}$ 12 requires that the meter measure the current I at two different levels, that is, load conditions, and match these two current readings with two corresponding meter input voltage readings. The difference in the two voltage readings is then divided by the difference in the two current readings to determine $Z_{INT}$ 12.

This measurement of $Z_{INT}$ 12 relies on the "open circuit" voltage of the transformer not changing during the measurement. Because the distribution system voltage can change with time, the current and voltage readings need to be repeated several times, for example, a dozen samples taken over a one day period, and the divided result needs to be averaged to conclusively determine the impedance $Z_{INT}$ 12.

Figure 2:
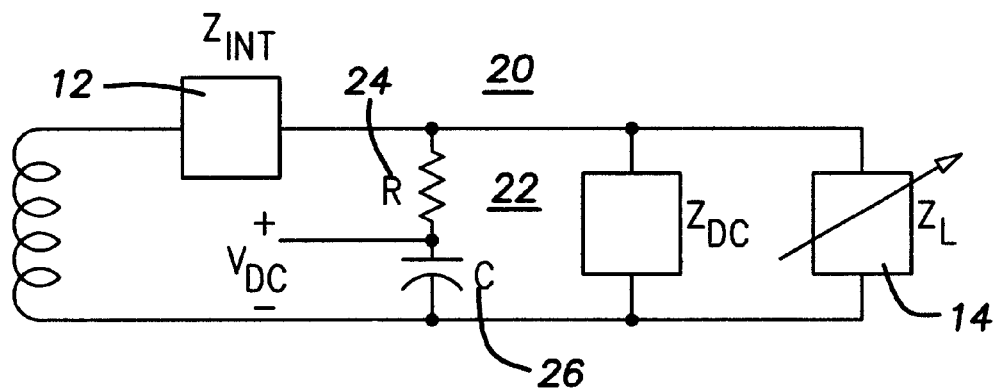
FIG. 2 shows a schematic diagram of the circuit for measuring the DC voltage in the AC voltage waveform.

Referring now to FIG. 2, there is shown the circuit 20 for measuring the DC voltage in the AC voltage waveform. Circuit 20 includes $Z_{INT}$ 12 and $Z_L$ 14. Circuit 20 also includes in parallel with $Z_L$ 14 a low pass filter 22 comprising the series combination of a resistor R 24 and a capacitor C 26. The DC voltage in the AC waveform is the result of DC loading on the transformer causing a DC voltage drop across $Z_{INT}$ 12. By properly selecting the component values for R 24 and C 26 of filter 22 almost all of the AC voltage is dropped across R 24 and the DC voltage is dropped across C 26.

Figure 3:
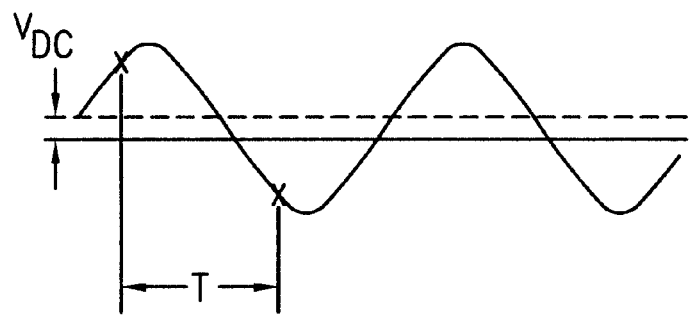
FIG. 3 shows the AC voltage waveform with the DC voltage component.

Referring now to FIG. 3, there is shown the AC voltage waveform with the DC voltage component. Because the values for R 24 and C 26 are not ideal there is some AC component remaining across C 26. One technique for removing this AC component is described in U.S. Pat. No. 4,500,837 ("the '837 Patent"), the disclosure of which is hereby incorporated herein by reference. As is described in the '837 Patent, the AC component remaining across C 26 is removed by taking alternate half cycle samples of the voltage across C 26. By properly adding the positive half cycle and the negative half cycle samples of the AC component, the alternating component is eliminated leaving only the DC voltage.

Since the transformer internal impedance $Z_{INT}$ 12 has previously been accurately determined, the measured DC voltage can then be converted very accurately into DC load current.

Once the level of DC current flow through the meter has been determined the reporting of tampering can be visually displayed on the meter or brought back through a communications system to a computer for display or warning and the meter billing parameters can be modified.

Figure 4:
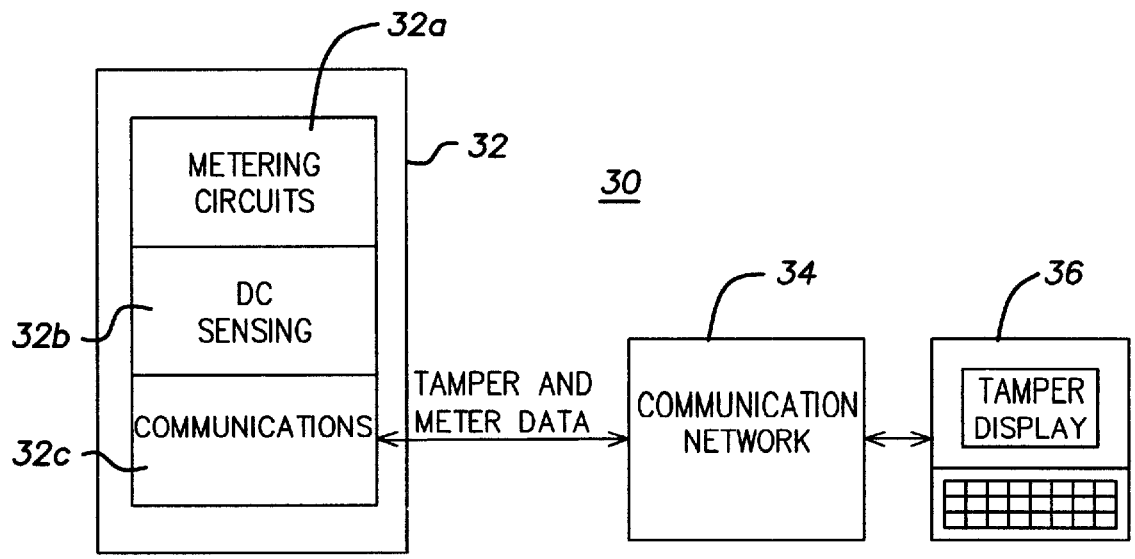
FIG. 4 shows a system for displaying the evidence of tampering at the supplier of electric power.

Referring now to FIG. 4, there is shown a system 30 for displaying the evidence of tampering at the supplier of electric power. Electric power meter 32 comprises well known metering circuits 32a, the DC sensing circuit 32b of the present invention and well known communications mechanisms 32c, such as radio, telephone or power line communication, by which the data determined by meter 32 can be communicated to the electric power provider. The meter data is transmitted through communication network 34 to a display 36 located at the electric power provider which can display evidence of power meter tampering by the customer. In addition to display or in lieu thereof the power provider may also take action such as modifying the customer's billing parameters and/or notifying field service personnel when the data from the meter 32 indicates that the customer is tampering with the meter.

Figure 5:
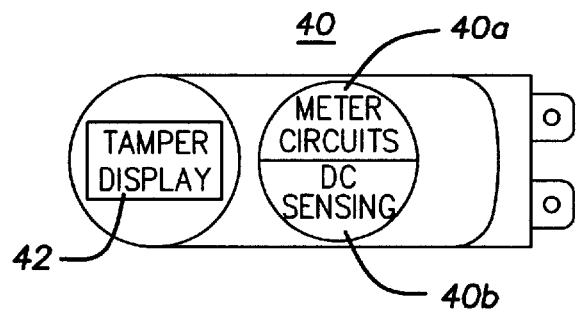
FIG. 5 shows a power meter that includes an internal display that can show evidence of tampering.

Referring now to FIG. 5 there is shown power meter 40 that has an internal display for displaying among other things evidence of customer tampering. Meter 40 includes well known metering circuits 40a and the DC sensing circuit 40b of the present invention. The meter 40 also includes display 42 for displaying among other things evidence of customer tampering with the meter.

It is to be understood that the description of the preferred embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A method for determining the DC current flowing through an AC power meter comprising:
   (a) measuring the internal impedance of a distribution transformer associated with said meter;
   (b) determining the amplitude of the DC voltage component of the AC voltage in said meter; and
   (c) calculating said DC current from said measured distribution transformer internal impedance and said determined DC voltage amplitude.

2. The method of claim 1 further comprising displaying in said power meter an indication that DC current flowing through said meter has been determined.

3. The method of claim 1 further comprising:
   (d) communicating to a provider of electric power connected to said distribution transformer an indication that DC current flowing through said meter has been determined; and
   (e) providing notice of said indication at said electric power provider.

4. In a power distribution network comprising:
   (a) a distribution transformer; and
   (b) one or more AC power meters associated with said distribution transformer;
   a method for determining the DC current flowing through at least one of said one or more AC power meters comprising:
   (i) measuring the internal impedance of said distribution transformer;
   (ii) determining the amplitude of the DC voltage component of the AC voltage in said at least one meter; and (iii) calculating said DC current from said measured distribution transformer internal impedance and said determined DC voltage amplitude.

5. The power distribution network of claim 4 further comprising a provider of electirc power connected to said distribution transformer.

6. The power distribution network of claim 5 wherein said method for determining the DC current flowing through at least one of said one or more AC power meters further comprises displaying in each of said at least one of said one or more AC power meters an indication that DC current flowing through each of least one of said one or more AC power meters has been determined.

7. The power distribution network of claim 5 wherein said method for determining the DC current flowing through at least one of said one or more AC power meters further comprises:

(iv) communicating to said provider of electric power connected to said distribution transformer an indication that DC current flowing through each of said at least one of said one or more AC power meters has been determined; and (v) providing notice of said indication at said electric power provider.

8. The power distribution network of claim 4 wherein said method for determining the DC current flowing through at least one of said one or more AC power meters further comprises:

(iv) communicating to a provider of electric power connected to said distribution transformer an indication that DC current flowing through each of said at least one of said one or more AC power meters has been determined; and (v) providing notice of said indication at said electric power provider.

9. The power distribution network of claim 4 wherein said method for determining the DC current flowing through at least one of said one or more AC power meters further comprises displaying in each of said at least one of said one or more AC power meters an indication that DC current flowing through each of least one of said one or more AC power meters has been determined.

10. A method for determining the internal impedance of a distribution transformer comprising:

(a) measuring for a first load condition the current flowing through said distribution transformer internal impedance;

(b) measuring for a second load condition the current flowing through said distribution transformer internal impedance;

(c) matching each of said current measurements for said first and said second load conditions with a corresponding input voltage reading of a power meter connected to the secondary of said distribution transformer;

(d) dividing the difference between said corresponding power meter input voltage readings by the difference between said current measurements for said first and said second load conditions; and (e) repeating steps (a) to (d) for a predetermined number of iterations performed over a predetermined period of time.

11. A method comprising:

(a) measuring for a first load condition the current flowing through a distribution transformer internal impedance;

(b) measuring for a second load condition the current flowing through said distribution transformer internal impedance;

(c) matching each of said current measurements for said first and said second load conditions with a corresponding input voltage reading of a power meter connected to the secondary of said distribution transformer;

(d) dividing the difference between said corresponding power meter input voltage readings by the difference between said current measurements for said first and said second load conditions; and (e) repeating steps (a) to (d) for a predetermined number of iterations performed over a predetermined period of time to determine the internal impedance of said distribution transformer.

12. The method of claim 11 further comprising:

(f) determining the amplitude of DC voltage component of the AC voltage in said power meter; and (g) calculating the DC current flowing through said AC power meter from said determined distribution transformer internal impedance and said determined DC voltage amplitude.

13. The method of claim 12 further comprising displaying in said power meter an indication that DC current flowing said power meter has been determined.

14. The method of claim 12 further comprising:

(h) communicating to a provider of electric power connected to said distribution transformer an indication that DC current flowing said power meter has been determined; and (i) providing notice of said indication at said electric power provider.

* * * * *